(12) United States Patent
Martin et al.

(10) Patent No.: US 7,642,850 B2
(45) Date of Patent: Jan. 5, 2010

(54) FEEDFORWARD LINEARIZATION OF RF POWER AMPLIFIERS

(75) Inventors: G. Patrick Martin, Merritt Island, FL (US); Christopher D. Moffatt, Palm Bay, FL (US); James Tonti, Valkaria, FL (US)

(73) Assignee: Harris Corporation, Melbourne, FL (US)

( * ) Notice: Subject to any disclaimer, the term of this patent is extended or adjusted under 35 U.S.C. 154(b) by 58 days.

(21) Appl. No.: 12/061,013

(22) Filed: Apr. 2, 2008

(65) Prior Publication Data

US 2009/0251211 A1 Oct. 8, 2009

(51) Int. Cl.
H03F 1/26 (2006.01)

(52) U.S. Cl. ........................................ 330/151

(58) Field of Classification Search .................. 330/52, 330/151
See application file for complete search history.

(56) References Cited

U.S. PATENT DOCUMENTS

| | | | |
|---|---|---|---|
| 5,861,777 A | 1/1999 | Sigmon et al. | |
| 5,892,397 A | 4/1999 | Belcher et al. | |
| 5,923,712 A | 7/1999 | Leyendecker et al. | |
| 6,078,216 A | 6/2000 | Proctor, Jr. | |
| 6,188,732 B1 | 2/2001 | Rha | |
| 6,271,724 B1 | 8/2001 | Neffling et al. | |
| 6,337,599 B2 | 1/2002 | Lee et al. | |
| 6,356,146 B1 | 3/2002 | Wright et al. | |
| 6,570,444 B2 | 5/2003 | Wright et al. | |
| 6,794,936 B2 | 9/2004 | Hsu et al. | |
| 6,834,084 B2 | 12/2004 | Hietala | |
| 6,937,669 B2 | 8/2005 | Tomerlin et al. | |
| 7,034,614 B2 * | 4/2006 | Robinson et al. | 330/151 |
| 7,142,615 B2 | 11/2006 | Hongo et al. | |
| 2002/0114403 A1 | 8/2002 | Garceran et al. | |
| 2004/0217811 A1 | 11/2004 | Nanao et al. | |
| 2005/0195919 A1 | 9/2005 | Cova | |
| 2007/0093227 A1 | 4/2007 | Lieback et al. | |

FOREIGN PATENT DOCUMENTS

| | | |
|---|---|---|
| EP | 1503495 A2 | 2/2005 |
| EP | 1 732 207 | 12/2006 |
| GB | 2 351 624 | 1/2001 |

OTHER PUBLICATIONS

U.S. Appl. No. 11/678,847, Moffatt.

* cited by examiner

Primary Examiner—Steven J Mottola
(74) Attorney, Agent, or Firm—Darby & Darby PC; Robert J. Sacco

(57) ABSTRACT

RF amplifier system (200) incorporating feedforward linearization. The system includes a digital waveform source (202) generating digital data s(t) representative of at least one analog signal. The system also includes a feedforward linearization circuit for reducing a distortion of an RF power amplifier (212). The feedforward linearization circuit includes a differential amplifier (230) arranged for generating an error signal. The error signal is determined based on a difference between the distorted RF output signal and an analog RF reference signal (229) generated from the digital data.

20 Claims, 2 Drawing Sheets ized to emit digital data to the first and second data converting subsystems at a particular time. The first and second data converting subsystems can be selected from the group consisting of a digital-to-analog converter and an RF modulator.

FEEDFORWARD LINEARIZATION OF RF POWER AMPLIFIERS

BACKGROUND OF THE INVENTION

1. Statement of the Technical Field

The inventive arrangements relate to methods for linearizing RF power amplifiers, and more particularly to a method for providing an envelope elimination and restoration (EER) amplifier with enhanced linearity.

2. Description of the Related Art

The migration of broadcast and other communications industries to complex digital waveforms has necessitated a degree of amplifier linearity that is unprecedented. Concurrently, there is a continuing demand for amplifiers that operate more efficiently and offer reduced power consumption. In the case of large transmitter installations, greater efficiency is important for reducing waste heat and costs. In other applications, such as that involving portable transceiver equipment, efficiency is important for reducing size, weight, and battery consumption.

One type of RF power amplifier which offers improved efficiency is the envelope elimination and restoration (EER) amplifiers. EER amplifiers are well known in the art and can achieve very highly efficient conversion of DC energy to RF energy for complex waveforms having a varying envelope. They operate by separately processing the envelope and phase information contained in a modulated input signal. The phase information is communicated to a power amplifier where it is amplified as a constant envelope signal. This permits such phase information to be amplified using highly efficient non-linear amplifiers. The envelope information contained in the input signal is restored to the phase information after the signal has been amplified.

Although highly efficient, EER amplifiers using Class E topologies are known to have poor linearity. This poor linearity causes significant amounts of signal distortion. For example, such distortion often arises from pulse-width modulator circuits that are used to control the output envelope voltage, and from switching non-linearities which exist in the circuit used for amplifying the phase information. The non-linearities cause spectral re-growth (out-of-band noise), which leads to adjacent channel interference. It also causes in-band distortion, which degrades the bit-error rate (BER) performance for digital modulation waveforms. In order to comply with FCC spectral masks, reduce BER, and achieve acceptable amplifier efficiency, linearization is necessary.

Distortion associated with RF power amplifiers is often characterized by means of an amplitude to amplitude (AM-to-AM) modulation curve and an amplitude-to-phase (AM-to-PM) modulation curve. The AM-to-AM modulation curve shows the RF power amplifier gain as a function of the input power. The AM-to-PM modulation curve shows the output phase variation of the RF power amplifier as a function of the input power. It will be appreciated that AM-to-AM distortion and AM-to-PM distortion can adversely affect the performance of an RF communication system. For example, such distortion can make it difficult to recover symbols at a receiving end of a communication link.

One well known method for improving the linearity of RF power amplifiers is known as feedforward linearization. With feedforward linearization, an RF splitter is typically used to separate a source signal into two separate signals. These two signals include a amplifier input signal and a reference signal. The amplifier input signal is provided to the amplifier as an input. A directional RF coupler is used to obtain a sample of the distorted output signal from the RF power amplifier. The reference signal and the sampled output from the directional coupler are communicated to separate inputs of a 180° hybrid RF signal combiner. The 180° hybrid RF hybrid combiner subtracts the reference signal from the distorted amplifier output. The resulting output from the combiner is an error signal. The error signal is subsequently amplified so as to scale the error signal to equal the power level of any distortion contained in the distorted output signal from the RF power amplifier. The error signal is then subtracted from the distorted output signal of the RF power amplifier to remove the distortion from the output signal.

Feedforward linearization is effective at improving amplifier linearity. However, it has not been particularly practical for certain amplifier applications. For example, the relatively large magnitude of the error signal needed to improve the linearity of highly non-linear amplifiers can require a relatively high power RF amplifier for scaling the error signal. The necessity for such a relatively high power RF amplifier for scaling the error signal can reduce the overall efficiency of the amplifier system. Thus, feedforward linearization has been limited with regard to its usefulness as applied to highly non-linear amplifiers, such as the EER type amplifier.

Another limitation of feedforward linearization concerns bandwidth. In feedforward linearization systems, it is important for the error signal to be a highly accurate representation of the actual distortion produced by the RF power amplifier. A distorted error signal will not properly remove non-linearities from the output of the amplifier. However, in the case where the signals to be amplified are wideband RF signals inaccuracy of the error signal can occur. For example, such inaccuracies can result from amplitude and phase variations which exist across the operating bandwidth of the RF components used to form and process the error signal. As noted above, such RF components can include RF signal splitters and 180° RF hybrid combiner circuits.

SUMMARY OF THE INVENTION

The invention concerns an RF amplifier system incorporating feedforward linearization. The system includes a digital multiplexer coupled to a digital waveform source. The digital multiplexer is configured to generate first and second instances of the digital data. A first data converting subsystem is coupled to the digital multiplexer for converting the first instance of the digital data to analog magnitude and phase signals defining the analog signal. An RF amplifier is coupled to the first data converting subsystem and is responsive to the magnitude and phase signals for generating a distorted RF output signal modulated by one or more of the magnitude and phase signals. A second data converting subsystem is configured for receiving the second instance of the digital data from the digital multiplexer and converting the second instance of the digital data to an analog RF reference signal.

A feedforward linearization circuit is provided for reducing a distortion of the RF amplifier. The distorted RF output signal and the analog RF reference signal are communicated to the feedforward linearization circuit. The feedforward linearization circuit includes a differential amplifier arranged for generating an error signal representing a difference between the distorted RF output signal and the analog RF reference signal. The feedforward linearization circuit also includes a combiner for combining the error signal with the distorted RF output signal for removing a distorted portion of the distorted RF output signal.

The RF amplifier system advantageously includes a digital data time delay device coupled to the digital multiplexer. The digital time delay device is configured for selectively delaying the second instance of the digital data so that the distorted RF output signal and the analog RF reference signal can be time aligned when they are communicated to the differential amplifier.

The invention also includes a method for linearizing an output signal of an RF amplifier. The method includes the steps of generating first and second instances of a digital data s(t) using a digital multiplexer. The method also includes converting the first instance of the digital data to analog magnitude and phase signals. A distorted RF output signal is generated by an RF amplifier responsive to the magnitude and phase signals. The RF output signal is modulated by at least one of the magnitude and phase signals. The method further includes converting the second instance of the digital data to an analog RF reference signal. The method continues by reducing a distortion of the distorted RF output signal using a feedforward linearization circuit. An error signal is generated by the feedforward linearization circuit. The error signal represents a difference between the distorted RF output signal and the analog RF reference signal. The method continues with the step of combining the error signal with the distorted RF output signal for removing a distorted portion of the distorted RF output signal.

BRIEF DESCRIPTION OF THE DRAWINGS

Embodiments will be described with reference to the following drawing figures, in which like numerals represent like items throughout the figures, and in which.

DETAILED DESCRIPTION OF THE PREFERRED EMBODIMENTS

The invention will now be described more fully hereinafter with reference to accompanying drawings, in which illustrative embodiments of the invention are shown. This invention, may however, be embodied in many different forms and should not be construed as limited to the embodiments set forth herein. For example, the present invention can be embodied as a method, a data processing system, or a computer program product. Accordingly, the present invention can take the form as an entirely hardware embodiment, an entirely software embodiment, or a hardware/software embodiment.

The system described herein is intended for improving the linearity of an RF power amplifier, and more particularly for improving the linearity of RF power amplifiers used to amplify broadband signals. As used herein, the term linear and/or linearity is used to describe the extent to which an RF amplifier is able to produce an amplified output signal which has a amplitude which is related to its input signal by some constant scaling factor over a defined dynamic operating range of the RF amplifier. Similarly, with regard to phase, the term linear or linearity is used to describe the degree to which such an RF amplifier can produce an amplified output signal which has a phase which is related to its input signal by some constant value over a defined dynamic operating range of the RF amplifier. The dynamic operating range, as that term is used herein, includes an expected range of signal amplitudes, and anticipated signal bandwidth.

There is a continuing demand for amplifiers that operate more efficiently with unprecedented levels of linearity. Certain types of amplifiers, such as envelope elimination and restoration (EER) amplifiers, are known to have very high operating efficiency. However, these same amplifiers are also known to have poor linearity. According to an embodiment of the invention, the linearity of such amplifiers can be improved by using an improved feedforward linearization technique.

Figure 1:
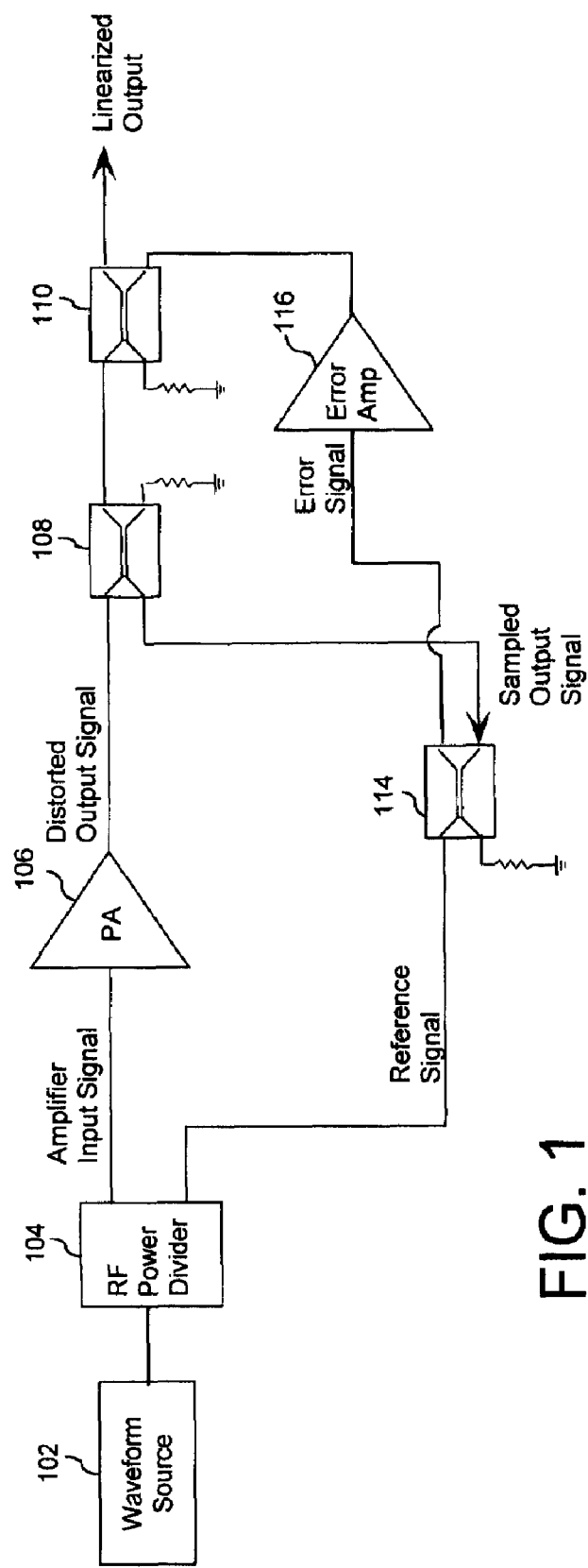
FIG. 1 is a block diagram of a conventional RF power amplifier arrangement which incorporates a feedforward system for improving the linearity of the RF power amplifier.

Referring now to FIG. 1, there is shown a simplified block diagram of an RF power amplifier system 100 which incorporates a feedforward system for improving the amplifier's linearity. In the RF power amplifier system 100, a waveform source 102 communicates a source RF signal to an RF power divider 104. The RF power divider is conventionally used to split an RF source signal into two separate signals. Typically, each of these signals will have an RF power which is approximately half that of the source RF signal. The two signals thus produced include an amplifier input signal and a reference signal. The amplifier input signal is provided as an input to the RF power amplifier 106. A directional coupler 108 is conventionally used to obtain a low power sample of the distorted output signal from the RF power amplifier 106.

The reference signal and the sampled output signal from the directional coupler 108 are communicated to separate inputs of a 180° hybrid RF signal combiner 114. The conventional 180° hybrid RF signal combiner subtracts the reference signal from the distorted amplifier output signal. The resulting output from the 180° hybrid RF signal combiner 114 is an error signal. The error signal is subsequently amplified in a linear error amplifier 116 so as to scale the error signal. In particular, the error signal is amplified so that its power level is properly scaled to equal the power level of any distortion contained in the distorted output signal from the RF power amplifier 106. The distorted output signal from the directional coupler is also communicated to a second directional coupler 10. In the second directional coupler 110, the error signal is combined with the distorted output signal in a subtraction operation. In particular, the RF error signal is subtracted from the distorted output signal of the RF power amplifier to remove the distortion from the output signal.

Figure 2:
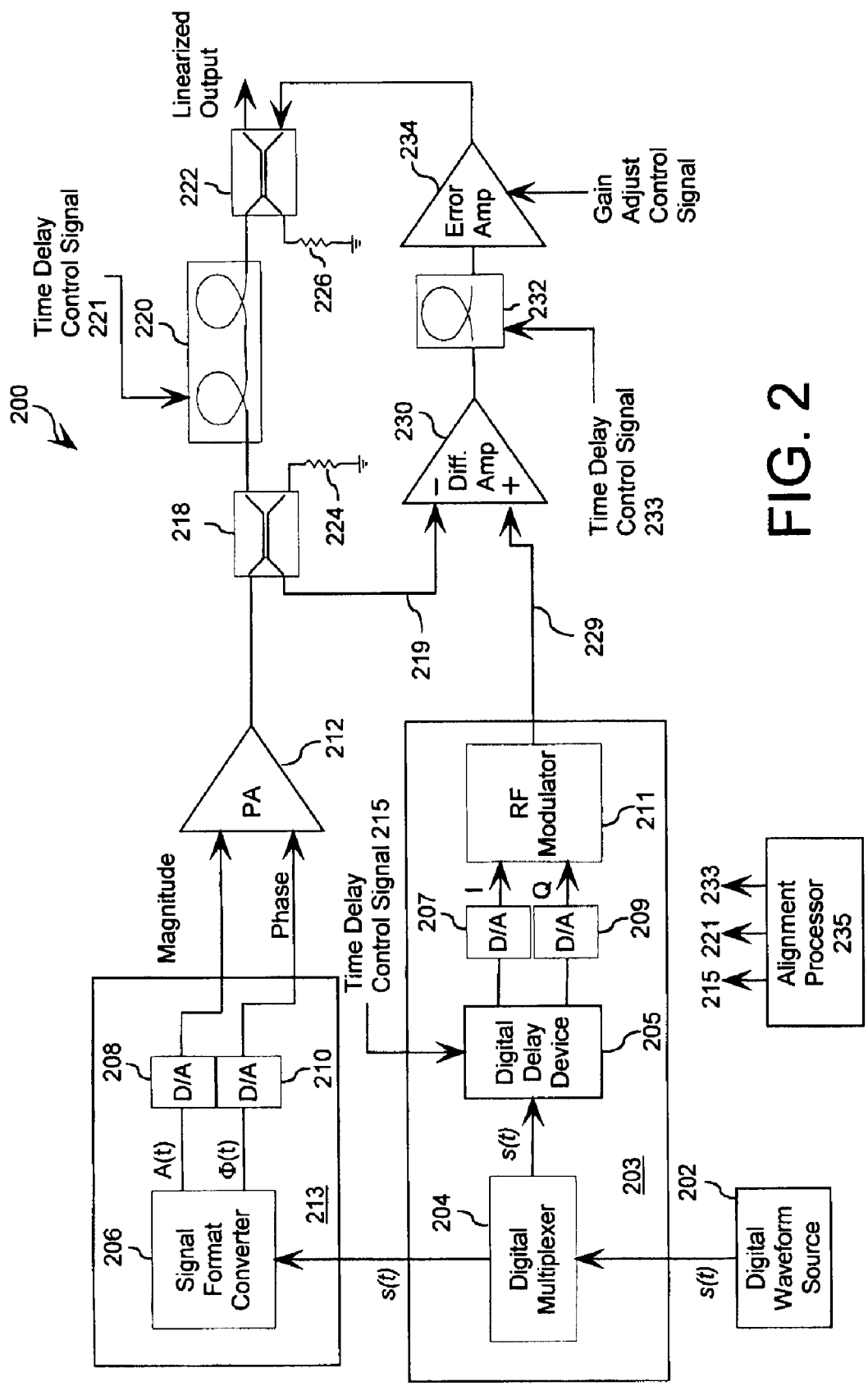
FIG. 2 is a block diagram that is useful for understanding an arrangement for an RF power amplifier arrangement which incorporates an improved feedforward system for correcting non-linearities in an output of an RF power amplifier.

FIG. 2 shows a simplified block diagram of an RF power amplifier system 200 with feedforward linearization incorporating a feedforward arrangement for removing non-linearities from the amplifier output. The arrangement shown is particularly useful for RF power amplifiers intended for use with wideband RF signals.

Referring now to FIG. 2, the RF power amplifier system 200 includes a digital waveform source 202 that generates digital data signal s(t). The digital data signal s(t) can be a conventional complex source signal. As used herein, a complex signal is any signal that is represented in terms of real and imaginary signal components. For convenience in describing the present invention, the digital data signal can be understood to be comprised of digital data that represents an analog signal comprised of in phase (I) and quadrature (Q) component vectors (I/Q component signal). Digital data of this type is well known in the art and therefore will not be described here in detail. Still, it should be understood that the invention is not limited in this regard. Instead, any other digital representation of a complex time varying analog signal can also be used. Regardless of the particular format selected for s(t) it should be understood that the digital waveform source 202 generates a signal which can be considered ideal in that it is an exact digital representation of the desired analog signal. In particular the digital data signal s(t) lacks any distortion associated with conventional analog signal processing.

The digital waveform source 202 can be realized in computer hardware, software, or a combination of hardware and software. In this regard it should be appreciated that the digital waveform source can be generated in one digital processing system, or in a distributed fashion where different processing elements are spread across several interconnected systems. Any kind of computer system, or other apparatus adapted for carrying out the methods described herein, is suited. A typical combination of hardware and software could be a general purpose computer processor or digital signal processor loaded with a computer program that controls the computer system such that it generates time varying digital representations of the I and Q signal components. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Referring again to FIG. 2, the digital data signal s(t) is communicated to reference signal generator block 203. Reference signal generator block 203 includes at least one digital circuit which is capable of providing two identical outputs comprising the digital data signal s(t) from a single digital data signal s(t) input. As will be readily appreciated by those skilled in the art, a wide variety of digital data circuits can be used for this purpose. For example, a digital multiplexer or digital data buffer can be used for this purpose. For convenience, the digital circuit is shown to be a digital multiplexer 204. However, the invention is not limited in this regard. All that is necessary is that some means be provided for generating two identical digital data signals s(t).

The digital data signal s(t) is used to generate an analog signal which is used as an input to the amplifier 212. Depending on the type of amplifier 212 which is used, it may be desirable to convert the digital data signal to a different format. A first data conversion subsystem 213 is provided for this purpose. For example, EER type amplifiers have separate processing paths for phase and amplitude information. For these types of amplifiers, it is necessary to convert an I/Q component signal to two analog signals that respectively represent amplitude and phase information. This amplitude and phase information is communicated to the EER amplifier as an input signal as is well known in the art.

If the inventive arrangements are intended for use with an EER type amplifier, the digital data signal s(t) is communicated to first data conversion subsystem 213 which includes a signal format converter 206. In the embodiment shown, the signal format converter would preferably be an I/Q to amplitude/phase (I/Q to A/P) converter. The signal format converter 206 converts the digital data signal s(t) (comprised of I and Q components) to an equivalent signal s'(t) in a different format. The equivalent signal s'(t) in this case is defined by a first component comprising a time varying amplitude signal A(t) and a second component comprised of a carrier signal that includes a time varying phase angle Φ(t). Converters of this type are well known in the art. Accordingly, signal format converter 206 will not be described in detail herein.

Those skilled in the art will readily appreciate that various types of RF power amplifiers may require signal formats other than that which is required by an EER type amplifier. Accordingly, if the invention is intended to be used with such other types of amplifiers, it may be necessary to substitute a different type of signal format converter in place of the I/Q to A/P converter. Thus it should be understood that invention is not limited to the use of an I/Q to A/P converter. Instead, any other suitable converter can be used for a particular amplifier application, and all such alternative converters are intended to be included in the scope of the present invention.

It should be understood that the magnitude and phase components A(t) and Φ(t) can be in digital format. Such signals must be converted to an analog format before being communicated to the RF power amplifier 212. For this purpose, the first data conversion sub-system 213 can also include digital to analog converters. For example, magnitude and phase components A(t) and Φ(t) are advantageously communicated to digital to analog (D/A) converters 208, 210. D/A converters are well known in the art and therefore will not be described here in detail.

The analog output from digital to analog converter 208, 210 will be communicated to power amplifier 212 where the signal will be amplified. According to one embodiment of the invention, the power amplifier 212 can be a switching amplifier, which is also sometimes referred to as a Class D amplifier. In power amplifier 212, the "magnitude" input is a baseband analog signal. The RF signal to be transmitted is generated in the power amplifier 212 and its amplitude modulation is controlled by the magnitude input signal. The "phase" input signal to power amplifier 212 controls the phase modulation of the RF signal that is generated by the power amplifier 212. Although switching amplifiers as described herein have several advantages, non-linearities which exist in such power amplifiers will result in an output that can be significantly distorted. Such non-linearities can be particularly significant if the power amplifier is of the EER type.

The distorted RF output signal from power amplifier 212 will be communicated to a directional coupler 218. Directional coupler 218 includes an input port connected to the power amplifier 212, a transmitted port connected to a delay line 220, an isolated port connected to a termination resistor 224, and a coupled port connected to the differential amplifier 230. The directional coupler 218 will communicate most of the distorted RF output signal from power amplifier 212 to a time delay device 220.

In general, it is preferable that at least about 90% of the distorted RF output signal will be communicated to the time delay device 220. According to one embodiment, directional coupler 218 can be selected to be a 50 dB directional coupler. With such a coupler, the distorted RF output signal communicated to the time delay device 220 will generally be no more than about 1 dB below the power level of distorted output signal produced by the power amplifier 212. Still, it should be understood that the invention is not limited in this regard. Higher or lower power levels can be communicated to the differential amplifier 230 and the time delay device 220.

Time delay device 220 compensates for the time-delays through differential amplifier 230, time delay device 232, and error amplifier 234. The time delay device 220 can be any device capable of producing a time delay in signals traversing through the time delay device. For example, the time delay device 232 can be a simple RF delay line consisting of a length of RF transmission line. Time delay device 220 can also have a time-delay control circuit (not shown) which is responsive to a time delay control signal 221 for varying a time delay produced by time delay device 220. Such time delay control circuit can be in place of or in addition to a time delay control circuit (not shown) provided in time delay 232, which is responsive to a time delay control signal 233. The output from the time delay device 220 will be communicated to a directional coupler 222. Time delay control signals 215, 221, and 233 can be generated by an alignment processor 235 which monitors one or more signals to ensure timing alignment of the signals comprising the linearized output from coupler 222. Alternatively, appropriate time delay control signals 215, 221, 233 can be determined by manual or automated means in an initial alignment process, and thereafter stored in a memory device.

Referring again to directional coupler 218, it can be observed in FIG. 2 that a portion of the distorted RF output signal from power amplifier 212 is coupled to the negative input of the differential amplifier 230. This signal shall be referred to herein as coupled signal 219. The coupled signal 219 will typically have a power level that is significantly reduced relative to the total RF input power communicated to the coupler 218 from the power amplifier 212. The actual power level of the coupled signal 219 will depend on a variety of design factors. However, the power level of coupled signal 219 will typically be no more than about 10% of the power level of the distorted output signal produced by the power amplifier 212. For example, the directional coupler 218 can be a 50 dB type directional coupler so that the coupled signal will have a power level that is about 50 dB below the power level of the distorted RF output signal from the power amplifier 212. Still, it should be understood that the invention is not limited in this regard.

A reference signal 229 is communicated to the positive input of the differential amplifier 230. This reference signal 229 is produced in reference signal generator 203, which will now be described in detail. The digital data signal s(t) provided from digital multiplexer 204 is communicated to a digital data time delay device 205 that is suitable for selectively delaying digital signals. In this regard, it should be understood that the digital data time delay device preferably operates in the digital domain. The digital data time delay device 205 can be of the fixed delay type. However, the digital time delay device 205 can also include a time delay control circuit (not shown) which allows selective variable control of the amount of delay applied to digital data signal s(t). The time delay control circuit can be controlled by a time delay control signal 215 as shown.

The digital time delay device 205 provides a time delay sufficient to ensure that the reference signal 229 is properly aligned in time with the coupled signal 219. This means that the path delays from the digital multiplexer 204 to the differential amplifier 230 are equalized for the reference signal 229 and the coupled signal 219. In particular, coupled signal 219 is delayed by the signal format converter 206, D/A converters 208, 210 and the power amplifier 212. In contrast, the reference signal is delayed by the D/A converters 207, 209, and an RF modulator 211. The respective amounts of delay encountered by each signal can be different. Accordingly, in order to properly compare the coupled signal 219 to the reference signal 229, the signals must be aligned in time. This time alignment is performed by delay device 205.

After the digital signal s(t) is processed by digital data time delay device 205, its output is communicated to one or more D/A converters 207, 209 which transforms the digital s(t) signal into an analog baseband signal. For example, these signals can be analog baseband I and Q signals. These signals are subsequently communicated to the RF modulator 211 which converts these analog baseband signals to an analog RF reference signal 229. For convenience, the combination of D/A converters 207, 209 and the RF modulator 211 are referred to herein as the second data converting subsystem. Alternatively, RF modulator 211 can be implemented in the digital-domain, provided that the D/A converters can sample at twice the RF frequency. If the RF modulator is implemented in the digital-domain, then only one D/A is required.

The analog RF reference signal 229 is an ideal reference signal in the sense that it is produced by an RF modulator 211 based on an exact digital representation of the desired source signal s(t) from digital waveform source 202. Also, it has been digitally delayed so as to provide correct time alignment. As such, it is absent of any significant distortion, such as the distortion caused by power amplifier 212.

The power level of the coupled signal 219 and the analog RF reference signal 229 are preferably selected so that they are equal. For example, if the power amplifier 212 has an output power of +53 dBm and the directional coupler is a 50 dB directional coupler, then the coupled signal 219 will have a power level of +3 dBm. In this case, the analog RF reference signal 229 would also be selected to have a power level of +3 dBm. Of course, other power levels can also be used, but it is advantageous that the power level of the analog RF reference signal 229 and the coupled signal power level 219 are equal. When the power levels are arranged in this way, the output of the differential amplifier 230 will be an inverted error signal that represents the distortion introduced to the power amplifier 212.

The inverted error signal output from the differential amplifier 230 is communicated to a time delay device 232. For example, the time delay device 232 can be a fixed RF delay line consisting of a length of transmission line. However, according to a preferred embodiment of the invention, the time delay device 232 can be selectively variable. For example, a variable length transmission line can be used for this purpose. However, other types of delay lines are also possible and the invention is not intended to be limited in this regard. For example any one of a variety of commercially available variable analog delay line device can be used. In this regard, it should be understood that the time delay device 232 can include at least one time delay control circuit for selectively varying the amount of time delay applied by the time delay device 232. As shown in FIG. 2, a time delay control signal 233 can be provided as an input to the time delay device to selectively vary the time delay. Notably, it is not necessary to have time delay device 232. Advantageously, time delay device 232 allows the time-delay control to operate on lower-power signals, while the fixed time-delay 220 operates on the high-power signals. Alternatively, time delay device 232 can be removed and time-delay control provided for time-delay 220. Removing the time-delay device 232 allows less time-delay to be required by device 220.

The inverted error signal output of the delay device 232 is communicated to at least one error amplifier 234. Error amplifier 234 is a linear amplifier which linearly amplifies the inverted error signal. According to an embodiment of the invention, a gain of the error amplifier can be adjustable by means of a gain adjustment control signal. The error amplifier 234 advantageously increases the power level of the inverted error signal so that it is equal to the power level of the distortion contained in the distorted amplifier output signal communicated to the directional coupler 222. After amplification, the inverted error signal is communicated from an output of the error amplifier 234 to the input of directional coupler 222. As noted above, directional couplers are well known in the art. According to one embodiment, the directional coupler 222 can be selected to be a 15 dB directional coupler. In this regard, it will be appreciated that a 15 dB coupling ratio for directional coupler 222 results in a minimal amount of RF power from power amplifier 212 being communicated to the termination resistor 226. However, the coupling is adequate for providing a sufficient amount of power from the error amplifier 234 to the linearized output signal from directional coupler 222 so as to substantially reduce distortion. Still, it should be understood that the particular coupling ratio for directional coupler 222 can be chosen by the designer. Of course, the output power from error amplifier 234 should be chosen to ensure that the error signal produced by the error amplifier has sufficient magnitude to compensate for distortion contained in the output signal from the power amplifier 212.

From the foregoing description it will be understood that there are two signals that are provided to the directional coupler 222. One signal is the distorted output signal from the power amplifier 212 and the other signal is the amplified inverted error signal from error amplifier 234. The directional coupler 222 is a four port device which couples the inverted error signal from error amplifier 234 to the distorted output signal. In this regard, it should be understood that the directional coupler 222 produces a linearized output signal at an output port that is the sum of the distorted output signal and the inverted error signal. Since the error signal is inverted, the summing operation can be thought of as an operation which involves subtracting the error signal from the distorted output signal. Since the inverted error signal is an inverted representation of the distortion which is present in the distorted output signal, this subtracting operation removes the distortion that is present in the distorted output signal. The result is a linearized output.

The present invention includes several features which together represent an important departure from the conventional feedforward type amplifier system of the prior as shown in FIG. 1. One such feature concerns the way in which the reference signal 229 is processed. Conventional feedforward type amplifier systems similar to the one shown in FIG. 1 use an analog RF signal splitter 104 to generate a reference signal 229. However, when applied to a feedforward linearization system, such conventional analog RF signal splitters 104 have several undesirable characteristics. Most significantly, conventional analog RF signal splitters can exhibit frequency dependent phase and amplitude variations. Stated differently, this means that the transfer characteristic of the signal splitter 104 can introduce phase and amplitude variations over a bandwidth of an input signal. When used in a feedforward linearization application, such RF signal splitters can cause reference signal variations in phase and amplitude. Consequently, a reference signal will result which is not ideal. Accordingly, the error signal in such cases will be inaccurate, such that the error signal can fail to properly improve the linearity of the output signal from amplifier.

In contrast, the present invention forms the reference signal by "splitting" the digital input signal s(t) while the signal is in the digital domain. This function is performed in digital multiplexer 204. The advantage of this approach is that it avoids the problem of phase and amplitude variations which typically occur over the bandwidth of an amplifier input signal when a conventional RF splitter is used. Such variations can be particularly problematic when the input signal is a wideband signal.

Another advantage of the approach described herein is that it facilitates use of a digital data time delay device 205 which operates in the digital domain. Use of a digital data time delay device 205 in this feedforward linearization application is advantageous for several reasons. The digital data delay device 205 operates in the digital domain and therefore avoids any potential distortion of the reference signal which might otherwise occur if an analog delay device was used. Second, variable time delay devices in the digital domain are relatively inexpensive, more easily implemented and digitally controlled. This is an advantage over variable analog time delay devices for RF signals. In particular, the use of a digital data time delay device 205 means that the linearization system can be rapidly reconfigured for use with different types of amplifiers 212.

Different amplifiers 212 can have different time delays associated therewith. Use of a digital data delay device 205 for the reference signal means that the linearization system in FIG. 2 can be used with two or more amplifiers without any significant design modifications. Instead, conventional digital control signals can be communicated to the digital delay device 205 to control the time delay as needed for a particular application. For example, such control signals can be provided by a suitable integrated circuit controller or programmable ROM.

Another important feature of the present invention concerns the manner in which the coupled signal 219 is subtracted from the reference signal 229. In particular, the present invention makes use of a differential amplifier 230 in place of a conventional 180° hybrid coupler 114 as shown in FIG. 1. Conventional 180° hybrid couplers suffer from two potential problems. First, 180° hybrid couples can and do exhibit frequency dependent variations in phase and amplitude. Such variations can be particularly problematic when the input signals to the 180° hybrid coupler is used to process signals having a relatively wide bandwidth. It will be appreciated by those skilled in the art that frequency dependent variations in phase and amplitude can produce distortion which will result in an inverted error signal which is inaccurate. In such case, the error signal can fail to properly improve the linearity of the output signal from power amplifier 212 because the error signal does not accurately represent the error.

In contrast, commercially available high precision integrated circuit differential amplifiers can offer much improved performance. Current commercially available high precision integrated circuit differential amplifiers are designed to operate at high frequencies. Such amplifiers have dramatically improved linearity as compared to 180° hybrid couplers, particularly when the input signals are of relatively wide bandwidths. Accordingly, such differential amplifier can provide a more accurate representation of an error signal.

Another problem with 180° hybrid couplers concerns the common mode rejection ratio (CMRR). The common-mode rejection ratio (CMRR) of a device is a measure of that device's tendency to reject input signals common to both inputs. In the present case, the CMRR refers to the ability of a 180° hybrid coupler 114 (or the differential amplifier 230) to completely and accurately determine the difference between a reference signal and a distorted amplifier output signal. A high CMRR is important in feedforward linearization applications because the distortion existing in the distorted amplifier output signal can often be a relatively small voltage compared to the amplitude of the distorted amplifier output signal. Typically, it is difficult to achieve a design of a 180° hybrid coupler with a CMRR of greater than about 50 dB. In contrast, current commercially available differential amplifier integrated circuits can achieve a CMRR of 100 dB or better. Use of such an integrated circuit has now become possible for many RF applications because of the wide operating bandwidth of currently available differential amplifiers. The combination of these features means that a high linearity differential amplifier can be used in place of the conventional 180° hybrid coupler in a feedforward linearization, and can offer a significant improvement in performance.

In general, the differential amplifier 230 should have a design which results in a common mode rejection ratio (CMRR) of at least about 50 dB. The differential amplifier should preferably have a bandwidth that is suitable for a range of input frequencies that are contained in the reference signal 229. For example, if the amplifier system 200 is intended for use with conventional broadcast signals in the AM or FM broadcast band, a linear differential amplifier having a bandwidth of between 10 MHz and 200 MHz can be used. Notably, the precise specification for the degree of linearity required of differential amplifier 230 will depend upon the level of the distortion to be eliminated from power amplifier 212. The differential amplifier 230 must be sufficiently free from distortion so that the amplifier can accurately generate an error signal based on a difference between the reference signal 229 and the coupled signal 219. There are a variety of commercially available products that can be used for implementing differential amplifier 230.

Notably, the amplifier system described herein can be used for a wide variety of signals, including broadband data signal. However, for wide band data signals, it is important that differential amplifier 230 and error amplifier 234 have a suitably wide operational bandwidth. In this regard, it should be understood that the differential amplifier 230 can be a conventional integrated circuit device, a hybrid circuit design, or an RF type differential amplifier. The particular type of circuit construction will be determined by the CMRR and bandwidth capability required in a particular application for processing particular types of broadband signals.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

We claim:

1. An RF amplifier system incorporating feedforward linearization, comprising:
    a digital multiplexer configured for receiving digital data s(t) from a digital waveform source and for generating first and second instances of said digital data;
    first converting means coupled to said digital multiplexer for converting said first instance of said digital data to analog magnitude and phase signals defining said analog signal;
    an RF amplifier coupled to said first converting means and responsive to said magnitude and phase signals for generating a distorted RF output signal modulated by at least one of said magnitude and phase signals;
    second converting means configured for receiving said second instance of said digital data from said digital multiplexer and converting said second instance of said digital data to an analog RF reference signal;
    a feedforward linearization circuit for reducing a distortion of said RF amplifier, said feedforward linearization circuit comprising a differential amplifier arranged for generating an error signal representing a difference between said distorted RF output signal and said analog RF reference signal; and
    combining means for combining said error signal with said distorted RF output signal for removing a distorted portion of said distorted RF output signal.

2. The RF amplifier system according to claim 1, wherein said digital data is a digital I/Q component signal and said first converting means comprises a signal format converter arranged for converting said digital I/Q component signal to at least one digital data signal comprising phase and magnitude information.

3. The RF amplifier system according to claim 2, wherein said first converting means further comprises at least one digital to analog converter coupled to said signal format converter and configured for converting said at least one digital data signal comprising phase and magnitude information to said analog magnitude and phase signals.

4. The RF amplifier system according to claim 1, further comprising a digital data time delay device coupled to said digital multiplexer configured for selectively delaying said second instance of said digital data.

5. The RF amplifier system according to claim 1, wherein said second converting means comprises at least one digital to analog converter configured for generating analog baseband I and Q components from said second instance of said digital data.

6. The RF amplifier system according to claim 5, wherein said second conversion means further comprises an RF modulator coupled to said at least one digital to analog converter and responsive to said baseband I and Q components of said analog reference signal for generating said analog RF reference signal.

7. The RF amplifier according to claim 1, further comprising an error amplifier having an input configured for receiving said error signal from said differential amplifier and an output coupled to said combining means, said error amplifier configured for amplifying said error signal.

8. The RF amplifier system according to claim 1, further comprising an analog time delay device coupled to at least one of said differential amplifier and said error amplifier, said analog time delay device configured for selectively delaying said error signal.

9. The RF amplifier system according to claim 1, wherein said RF amplifier is an EER type amplifier.

10. A method for linearizing an output signal of an RF amplifier, comprising:
    generating first and second instances of a digital data s(t) using a digital multiplexer;
    converting said first instance of said digital data to analog magnitude and phase signals;
    generating a distorted RF output signal modulated by at least one of said magnitude and phase signals using an RF amplifier responsive to said magnitude and phase signals;
    converting said second instance of said digital data to an analog RF reference signal;
    reducing a distortion of said distorted RF output signal using a feedforward linearization circuit which generates an error signal representing a difference between said distorted RF output signal and said analog RF reference signal, and combines said error signal with said distorted RF output signal for removing a distorted portion of said distorted RF output signal and for generating at least one linearized output signal,
    wherein said reducing further comprises monitoring said distorted RF output signal and said analog RF reference and generating time delay signals based on said monitoring for time delaying said distorted RF output signal, said analog RF reference signal, and said second instance of said digital data to ensure a timing alignment for said generating of said linearized output signal.

11. A method for linearizing an output signal of an RF amplifier, comprising:
    generating first and second instances of a digital data s(t) using a digital multiplexer;

converting said first instance of said digital data to analog magnitude and phase signals;

generating a distorted RF output signal modulated by at least one of said magnitude and phase signals using an RF amplifier responsive to said magnitude and phase signals;

converting said second instance of said digital data to an analog RF reference signal;

reducing a distortion of said distorted RF output signal using a feedforward linearization circuit which generates an error signal representing a difference between said distorted RF output signal and said analog RF reference signal, and combines said error signal with said distorted RF output signal for removing a distorted portion of said distorted RF output signal, wherein said first instance of said digital data is a digital I/Q component signal and further comprising converting said first instance of said digital data to digital magnitude and phase data.

12. The method according to claim 11, further comprising converting said digital magnitude and phase data to said analog magnitude and phase signals.

13. The method according to claim 10, further comprising selectively delaying said second instance of said digital data using a digital time delay device.

14. A method for linearizing an output signal of an RF amplifier, comprising:

generating first and second instances of a digital data s(t) using a digital multiplexer;

converting said first instance of said digital data to analog magnitude and phase signals;

generating a distorted RF output signal modulated by at least one of said magnitude and phase signals using an RF amplifier responsive to said magnitude and phase signals;

converting said second instance of said digital data to an analog RF reference signal;

reducing a distortion of said distorted RF output signal using a feedforward linearization circuit which generates an error signal representing a difference between said distorted RF output signal and said analog RF reference signal, and combines said error signal with said distorted RF output signal for removing a distorted portion of said distorted RF output signal; and generating analog baseband I and Q components from said second instance of said digital data.

15. The method according to claim 14, further comprising generating said analog RF reference signal using an RF modulator responsive to said analog baseband I and Q components.

16. The RF amplifier according to claim 10, further comprising amplifying said error signal using prior to combining said error signal with said distorted RF output signal.

17. The method according to claim 10, further comprising selectively delaying said error signal using an analog time delay device.

18. An RF amplifier system incorporating feedforward linearization, comprising:

a digital multiplexer coupled to a digital waveform source for generating first and second instances of a digital data signal s(t);

first converting means coupled to said digital multiplexer for converting said first instance of said digital data to analog magnitude and phase signals;

an RF amplifier coupled to said first converting means and generating a distorted RF output signal modulated by said analog magnitude and phase signals;

second converting means configured for receiving said second instance of said digital data from said digital multiplexer and converting said second instance of said digital data to an analog RF reference signal;

a feedforward linearization circuit for reducing a distortion of said RF amplifier using an error signal representing a difference between said distorted RF output signal and said analog RF reference signal to generate at least one linearized output signal; and an alignment processor for monitoring said distorted RF output signal and said analog RF reference, and for generating time delay signals based on said monitoring for said distorted RF output signal, said analog RF reference signal, and said second instance of said digital data to ensure a timing alignment for said generating of said linearized output signal.

19. An RF amplifier system incorporating feedforward linearization, comprising:

a digital multiplexer coupled to a digital waveform source for generating first and second instances of a digital data signal s(t);

first converting means coupled to said digital multiplexer for converting said first instance of said digital data to analog magnitude and phase signals;

an RF amplifier coupled to said first converting means and generating a distorted RF output signal modulated by said analog magnitude and phase signals;

second converting means configured for receiving said second instance of said digital data from said digital multiplexer and converting said second instance of said digital data to an analog RF reference signal; and a feedforward linearization circuit for reducing a distortion of said RF amplifier, wherein said feedforward linearization circuit is comprised of a differential amplifier having as a first input a sample of said distorted RF output signal, and as a second input said analog RF reference signal, and generating an error signal representing a difference between said distorted RF output signal and said analog RF reference signal.

20. The RF amplifier system according to claim 19, wherein said feedforward linearization circuit is further comprised of combining means configured for combining said error signal with said distorted RF output signal for removing a distorted portion of said distorted RF output signal.

* * * * *